United States Patent
Perlov et al.

(10) Patent No.: US 6,532,866 B2
(45) Date of Patent: Mar. 18, 2003

(54) METHOD AND APPARATUS FOR ORIENTING SUBSTRATES

(75) Inventors: Ilya Perlov, Santa Clara, CA (US); Eugene Gantvarg, Santa Clara, CA (US); Leonid Tertitski, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/117,885

(22) Filed: Apr. 8, 2002

(65) Prior Publication Data

US 2002/0111710 A1 Aug. 15, 2002

Related U.S. Application Data (62) Division of application No. 09/482,362, filed on Jan. 13, 2000, now Pat. No. 6,393,337.

(51) Int. Cl.[7] ............................................. B30B 15/06
(52) U.S. Cl. ........................................................ 100/229
(58) Field of Search .......................... 700/229; 414/757, 414/777, 754, 936, 938; 118/728

(56) References Cited

U.S. PATENT DOCUMENTS

| | | |
|---|---|---|
| 3,982,627 A | 9/1976 | Isohata |
| 4,892,455 A | 1/1990 | Hine |
| 5,183,378 A | 2/1993 | Asano et al. |
| 5,382,806 A | 1/1995 | Bacchi et al. |
| 5,533,243 A | 7/1996 | Asano |
| 5,648,854 A | 7/1997 | McCoy et al. |
| 5,759,007 A | 6/1998 | Nichols et al. |
| 5,853,284 A | 12/1998 | Ohzeki et al. |
| 6,027,301 A1 | 2/2001 | Kim et al. |
| 6,203,268 B1 | 3/2001 | Miyashita et al. |
| 6,222,339 B1 | 4/2001 | Yamasaki et al. |
| 6,270,307 B1 | 8/2001 | Sinha |

Primary Examiner—Christopher P. Ellis
Assistant Examiner—Gene O. Crawford
(74) Attorney, Agent, or Firm—Dugan & Dugan LLP (57) ABSTRACT

A multiple substrate orienter is provided that includes a rotatable substrate handler having a plurality of substrate support portions, each adapted to support a substrate. The multiple substrate orienter also includes a plurality of stacked substrate supports, each adapted to support a substrate. A plurality of substrate orientation marking (SOM) detectors are provided, and each SOM detector is coupled to a different one of the substrate supports and is adapted to identify a presence of an SOM of a substrate positioned close enough to the SOM detector to allow SOM detection by the SOM detector. The multiple substrate orienter further includes a plurality of lift and lower mechanisms, each lift and lower mechanism coupled to a different one of the substrate supports and adapted to individually lift and lower the substrate support to which the lift and lower mechanism is coupled. Numerous other aspects are provided.

9 Claims, 6 Drawing Sheets

METHOD AND APPARATUS FOR ORIENTING SUBSTRATES

This application is a division of U.S. patent application Ser. No. 09/482,362, filed Jan. 13, 2000 now U.S. Pat. No. 6,393,337, which is hereby incorporated by reference herein in its entirety.

FIELD OF THE INVENTION

The present invention relates to substrate processing (e.g., semiconductor device fabrication, flat panel display fabrication, etc.) and more specifically to a method and apparatus for orienting substrates (e.g., semiconductor wafers, glass substrates for flat panel displays, etc.).

BACKGROUND OF THE INVENTION

Proper alignment or "orientation" of substrates is often required during substrate processing. For example, proper semiconductor wafer orientation is required during processing steps sensitive to wafer orientation (e.g., lithographic processes, masking steps, etc), for reading information scribed on a wafer's backside (e.g., lot number wafer serial number, etc.) and the like. Accordingly, to identify wafer orientation, semiconductor wafers are provided with a flattened edge region termed a "flat" along an otherwise rounded wafer edge, or a small portion of a wafer's edge is removed to form a "notch" therein.

Conventional wafer orientation devices typically comprise a platform having a rotatable surface, and a wafer orientation sensor (e.g., an optical sensor) positioned a small distance above the platform. To achieve a desired wafer orientation, a wafer is placed on the rotatable surface of the platform, the rotatable surface is rotated (so as to rotate the wafer) and the wafer position sensor is employed to identify when a flat or notch of the wafer is in a predetermined position. The wafer position sensor then transmits this information to the platform to cease wafer rotation. Accordingly, wafer transfer to, wafer orientation by, and wafer transfer from conventional wafer orienting devices follows the same sequence: 1) a wafer handler extracts a first wafer from a multi-slot wafer carrier and transports the first wafer to the wafer orienting device; 2) the wafer orienting device orients the first wafer; and 3) the wafer handler returns the oriented first wafer to the multi-slot wafer carrier. Thereafter the sequence repeats and the wafer handler extracts a second wafer from the multi-slot wafer carrier and transports the second wafer to the wafer orienting device, etc.

As indicated by the sequence described above, conventional wafer orienting devices allow only one wafer to be oriented at a time. Such operation reduces throughput and increases wafer processing costs. Further, expensive and large footprint orienting equipment (e.g., a separate wafer platform, a motor required for rotation thereof, etc.) is also required. Accordingly a need exists for an improved wafer orienting device.

SUMMARY OF THE INVENTION

To address the needs of the prior art, a wafer orienter is provided that can simultaneously orient multiple substrates while occupying a small footprint. A small footprint preferably is achieved primarily by employing equipment already present within most device fabrication tools (e.g., so that the equipment does not consume any additional space) and by implementing the orienter in a compact, vertically stacked configuration. Simultaneous substrate orientation significantly increases substrate throughput, thereby decreasing cost per unit substrate processed. A small footprint further decreases cost per unit substrate processed by reducing cleanroom space requirements.

In accordance with the present invention, a multiple substrate orienter is provided that includes a rotatable substrate handler having a plurality of substrate support portions, each adapted to support a substrate. The multiple substrate orienter also includes a plurality of stacked substrate-supports, each adapted to support a substrate. A plurality of substrate orientation marking (SOM) detectors are provided, and each SOM detector is coupled to a different one of the substrate supports and is adapted to identify a presence of an SOM (e.g., a wafer flat or notch) of a substrate positioned close enough to the SOM detector to allow SOM detection by the SOM detector. The multiple substrate orienter further includes a plurality of lift and lower mechanisms, each lift and lower mechanism coupled to a different one of the substrate supports and adapted to individually lift and lower the substrate support to which the lift and lower mechanism is coupled. Alternatively, each lift and lower mechanism may be coupled to a different one of the substrate support portions of the rotatable substrate handler and adapted to individually lift and lower the substrate support portion to which the lift and lower mechanism is coupled.

Preferably the multiple substrate orienter includes a controller coupled to the rotatable substrate handler, to the plurality of SOM detectors and to the plurality of lift and lower mechanisms. The controller preferably has program code adapted to simultaneously rough orient a plurality of substrates loaded onto the substrate support portions of the rotatable substrate handler, and to individually fine orient each rough oriented substrate. As used herein, to "simultaneously rough orient a plurality of substrates" means to perform at least one portion of a rough orientation process simultaneously on the plurality of substrates, although each and every portion of the rough orientation process need not be performed simultaneously on all of the substrates. To "individually fine orient each rough oriented substrate" means to fine orient each rough oriented substrate one substrate at a time (e.g., not simultaneously).

In another aspect of the invention, a substrate orienter is provided the rotatable substrate handler of which has a single substrate support portion adapted to support a single substrate. Both aspects of the invention employ the substrate handler's rotational capability for substrate orienting, and both aspects perform a high speed rough orient which considerably reduces the time required for substrate orienting, as compared to conventional methods.

Other objects, features and advantages of the present invention will become more fully apparent from the following detailed description of the preferred embodiments, the appended claims and the accompanying drawings.

DETAILED DESCRIPTION

Figure 1A:
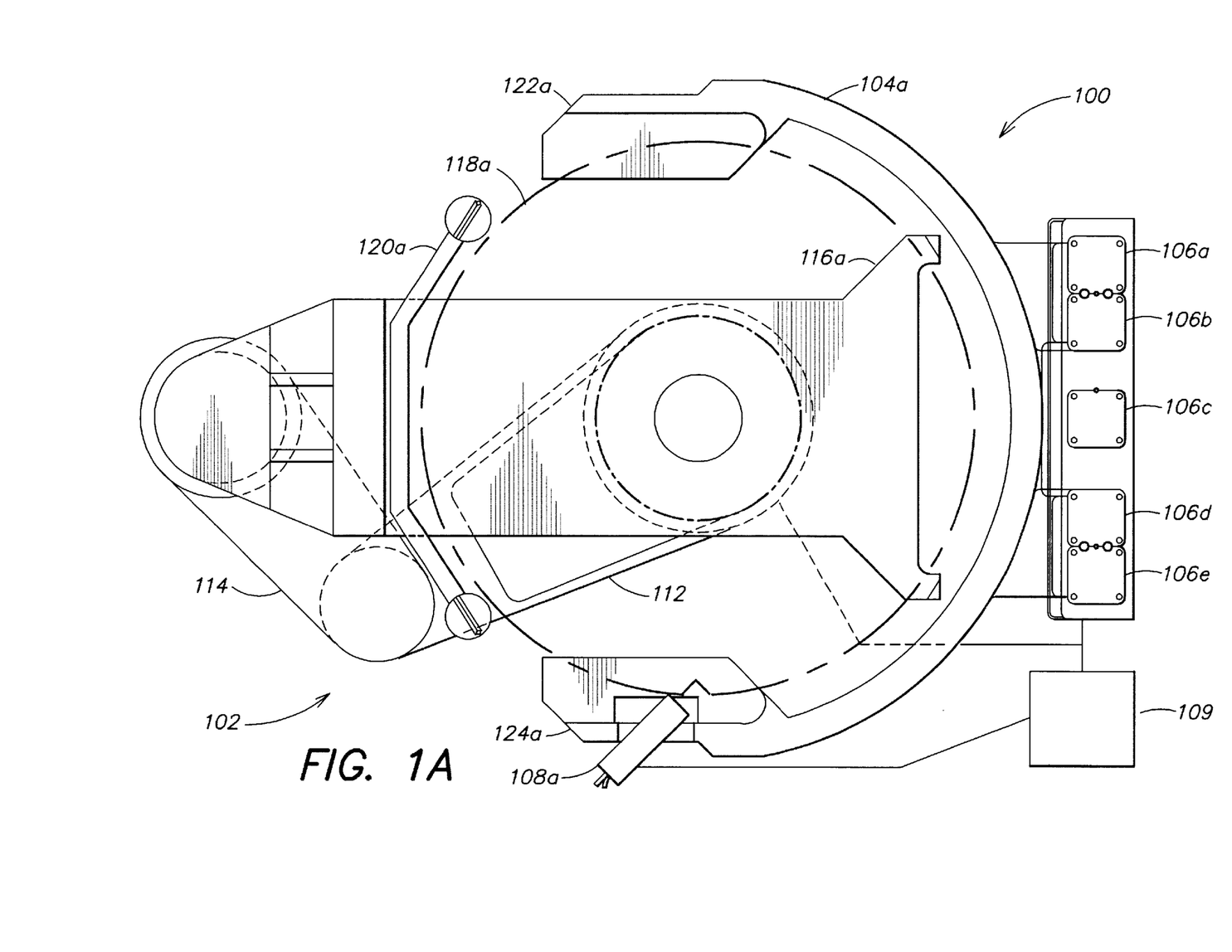
FIGS. 1A and 1B are a top plan view and a side elevational view, respectively, of an inventive multiple substrate orienter configured in accordance with the present invention.
Figure 1B:
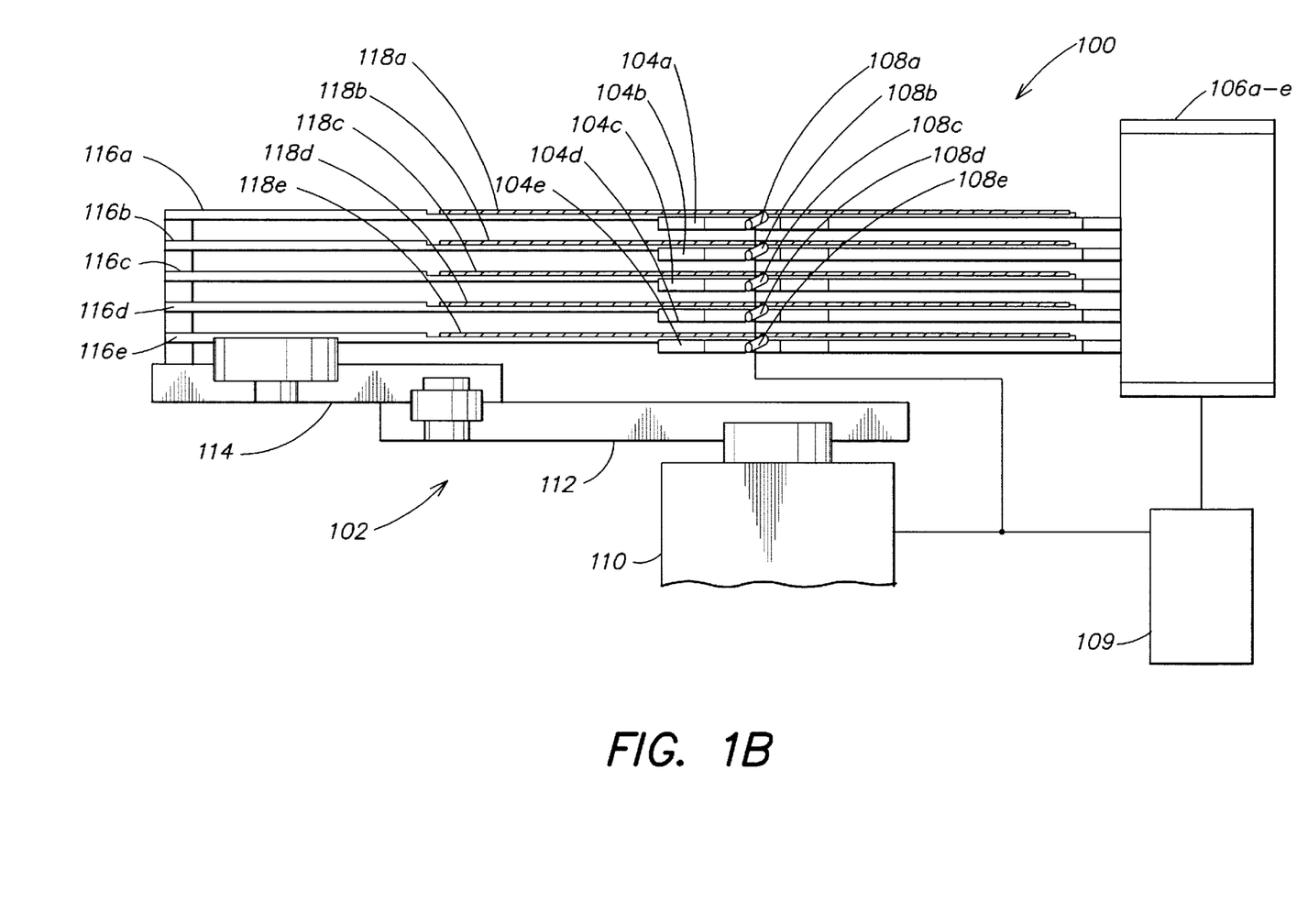

FIGS. 1A and 1B are a top plan view and a side elevational view, respectively, of an inventive multiple substrate orienter 100 configured in accordance with the present invention. For convenience, the multiple substrate orienter 100 is described with reference to semiconductor wafer handling equipment. However, it will be understood that the multiple substrate orienter 100 may be adapted to employ other substrate handling equipment (e.g., glass substrate handling equipment for flat panel displays, etc.).

As shown in FIGS. 1A and 1B, the multiple substrate orienter 100 comprises a rotatable substrate handler 102, a plurality of vertically stacked substrate supports 104a–e and a plurality of lift and lower mechanisms 106a–e coupled to the substrate supports 104a–e. A substrate orientation marking (SOM) detector 108a–e (e.g., a detector for determining the presence of a wafer notch or flat) is coupled to each substrate support 104a–e, respectively, as shown in FIG. 1B. A controller 109 is coupled to the rotatable substrate handler 102, to the lift and lower mechanisms 106a–e and to the SOM detectors 108a–e and includes program code (e.g., software) for controlling the operation of the multiple substrate orienter 100 as described below with reference to FIG. 3. The controller may comprise, for example, a dedicated controller for the multiple substrate orienter 100, a remote computer system for running a fabrication process, a manufacturing execution system, etc.

The rotatable substrate handler 102 includes a base 110 about which the entire wafer handler may rotate, a first extension 112 rotatably coupled to the base 110, a second extension 114 rotatably coupled to the first extension 112 and a plurality of substrate support portions 116a–e rotatably coupled to the second extension 114 but preferably fixedly coupled to one another so that the substrate support portions 116a–e move together as a unit.

Each substrate support portion 116a–e preferably comprises a blade configuration (as shown by the substrate support portion 116a of FIG. 1A) having a width less than a diameter of a substrate 118a–e supported thereon. Each substrate support portion 116a–e further includes a gripper mechanism 120a–e for pressing against an edge of each substrate 118a–e to secure each substrate 118a–e during transport and/or to center each substrate 118a–e as is known in the art.

Each substrate support 104a–e preferably is configured to support a substrate near an edge of the substrate, such as via a first and second edge support 122a–e, 124a–e (FIG. 1A). In this manner, substrates 118a–e may be placed on the substrate supports 104a–e by the substrate support portions 116a–e without the substrate support portions 116a–e contacting or otherwise interfering with the substrate supports 104a–e.

The lift and lower mechanisms 106a–e are configured to individually lift and lower each substrate support 104a–e (e.g., each substrate support may be raised and lowered independently of the other substrate supports), and preferably comprise computer controllable, pneumatic cylinders that raise/lower under the influence of compressed air as is well known in the art. As described further below, the lift and lower mechanisms 106a–e alternatively may be coupled to the substrate support portions 116a–e (FIG. 1C) so as to allow each of the substrate support portions 116a–e to be individually raised and lowered instead of the substrate supports 104a–e.

Figure 2A:
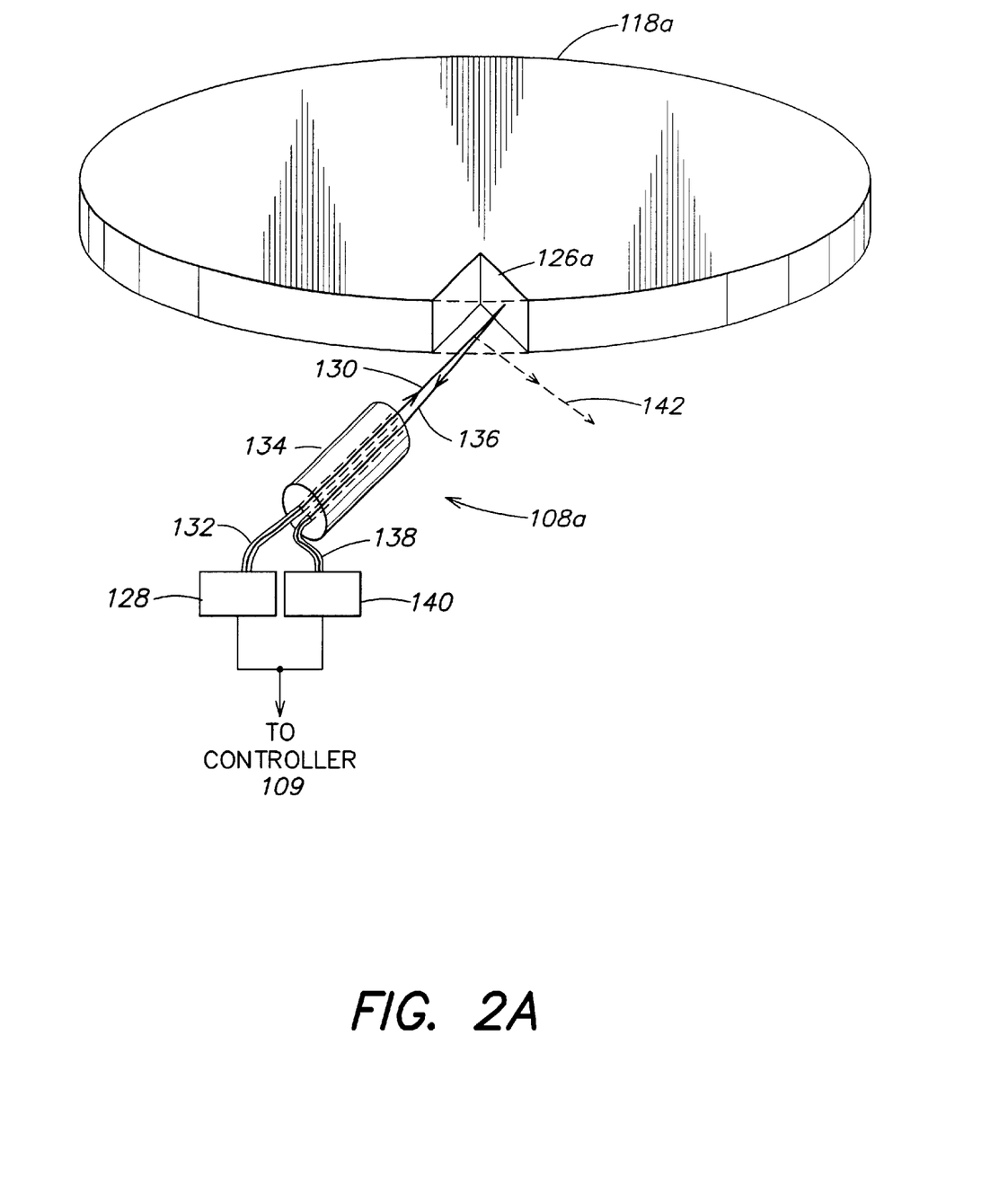
FIGS. 2A and 2B are perspective views of a preferred SOM detector for use with the multiple substrate orienter of FIGS. 1A and 1B or with the multiple substrate orienter of FIG. 1C.

The SOM detectors 108a–e may comprise any known detector for determining the presence or absence of a substrate orientation marking. However, for substrates employing a flat or a notch, the SOM detectors 108a–e preferably comprise fiber-optic-based sensors coupled to the second edge supports 124a–e of the substrate supports 104a–e as shown in FIGS. 1A and 1B. For example, FIG. 2A is a perspective view of the preferred SOM detector 108a of FIG. 1A when the substrate 118a comprises a notch 126a as a substrate orientation marking. The notch 126a typically has sidewalls at a 450 angle to a substrate diameter.

The SOM detector 108a comprises a laser source 128 (e.g., a laser diode such as a GaAs-based semiconductor laser diode) that outputs a laser beam 130. The laser beam 130 is directed toward the notch 126a via a first fiber optic cable 132 positioned (via a fiber optic support 134) so that the laser beam 130 exits the first fiber optic cable 132 and strikes the notch 126a if the substrate 118a is aligned with the detector 108a as shown. (The laser beam 130 preferably strikes the notch 126a approximately perpendicularly.

Figure 2B:
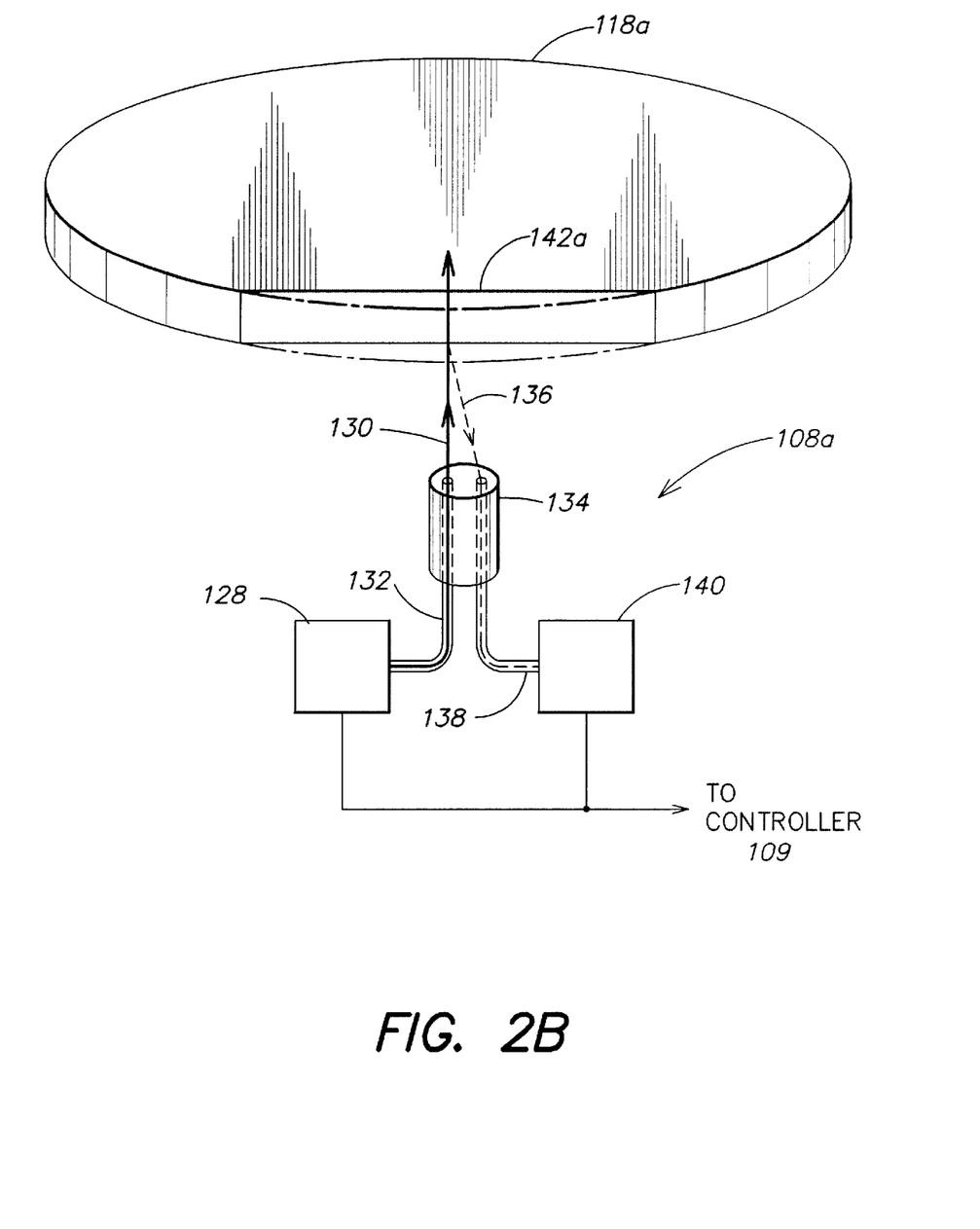

When the laser beam 130 strikes the notch 126a, a "collectable" reflected laser beam 136 is generated. The reflected laser beam 136 is collected by a second fiber optic cable 138 (also supported by the fiber optic support 134) and is transmitted thereby to a photodetector 140 (e.g., a silicon, junction based photodiode). However, if the substrate 118a is rotated so that the laser beam 130 does not strike the notch 126a, a "non-collectable" reflected laser beam 142 is generated and travels away from the second fiber optic cable 138 as shown in phantom. Accordingly, when the substrate 118a is oriented so that the laser beam 130 strikes the notch 126a, the photodetector 140 detects reflected light; otherwise, when the substrate 118a is oriented so that the laser beam 130 strikes another edge portion of the substrate 118a, the photodetector 140 does not detect reflected light. The SOM of the substrate 118a thereby is easily found by aligning the substrate 118a with the SOM detector 108a so that the laser beam 130 strikes the notch 126a. Note that the SOM detector 108a also may be configured so that reflected light is not detected by the photodetector 140 when the substrate 118a's SOM is aligned with the SOM detector 108a but is detected when the substrate 118a's SOM is not aligned with the SOM detector 108a. For example, FIG. 2B shows the SOM detector 108a positioned so that a collectible reflected light beam 136 is generated only when an SOM (shown as a flat 142a although a notch may be similarly detected) of the substrate 118a is not aligned with the SOM detector 108a. When the SOM of the substrate 118a is aligned with the SOM detector 108a, no reflected beam is generated as the laser beam 130 does not strike the substrate 118a. Note that the SOM detector 108a may be positioned above or below the substrate 118a.

Figure 3:
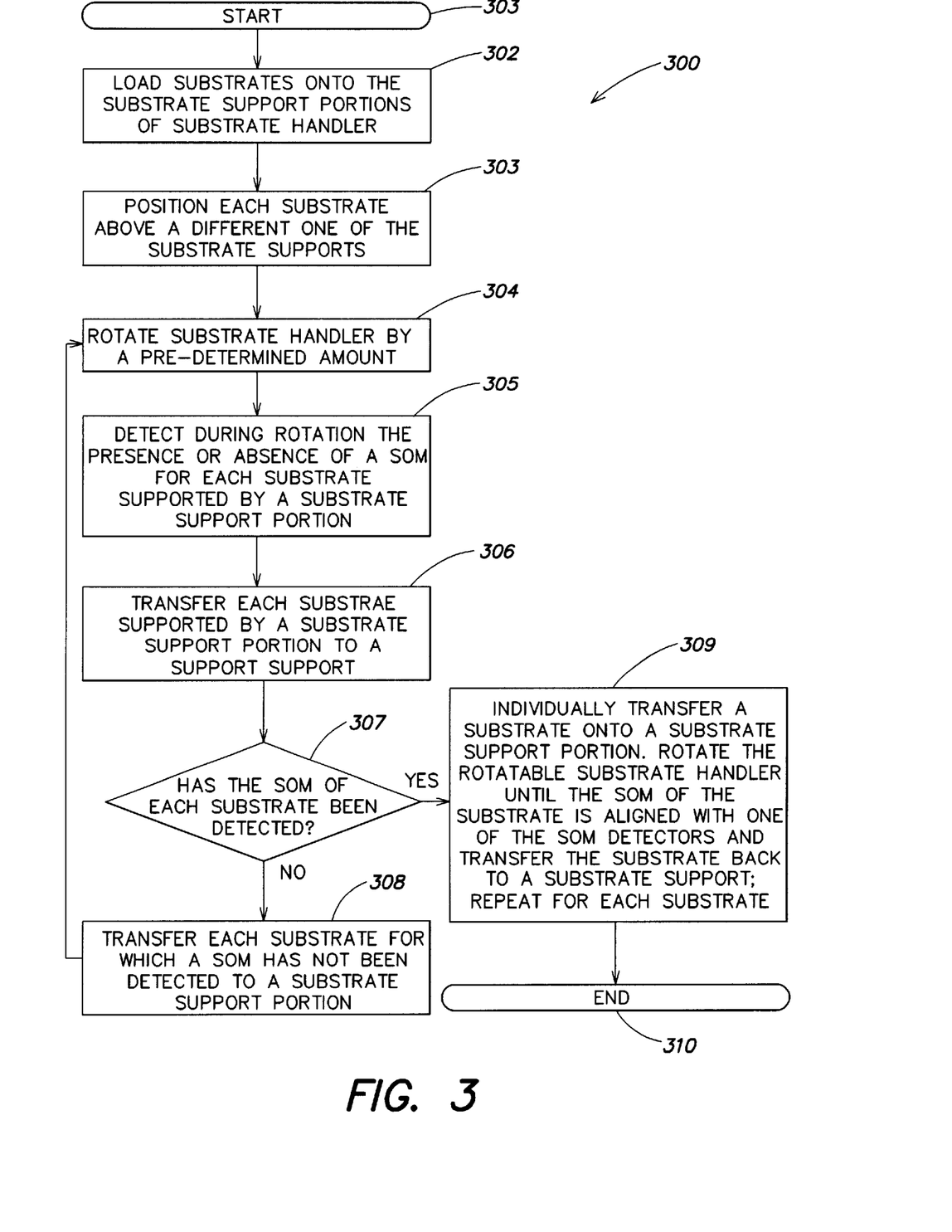
FIG. 3 is a flowchart of the preferred operation of the multiple substrate orienter of FIGS. 1A and 1B.

FIG. 3 is a flowchart 300 of the preferred operation of the multiple substrate orienter 100. Preferably, the controller 109 comprises program code for controlling the multiple substrate orienter 100 in accordance with the flowchart 300.

With reference to FIG. 3, in step 301, the operation of the multiple substrate orienter 100 begins. In step 302, a substrate is loaded onto each substrate support portion 116a–e of the rotatable substrate handler 102. For example, the rotatable substrate handler 102 may simultaneously load the substrates 118a–e onto the substrate support portions 116a–e by extending the first extension 112, the second extension 114 and/or the substrate support portions 116a–e so as to position the substrate support portions 116a–e under the substrates 118a–e (stored within a substrate carrier (not shown)), and by indexing the substrate carrier to lower the substrates 118a–e onto the substrate support portions 116a–e.

In step 303, the first extension 112, the second extension 114 and/or the substrate support portions 116a–e retract as shown in FIGS. 1A and 1B to position each substrate 118a–e supported by the substrate support portions 116a–e above a different one of the substrate supports 104a–e. Thereafter, in step 304, the rotatable substrate handler 102 is rotated by a pre-determined amount, preferably by about 900 as limited primarily by contact between the substrate support portions 116a–e and the substrate supports 104a–e. During rotation of the rotatable substrate handler 102, in step 305, the presence or absence of a substrate orientation marking (e.g., a notch or a flat) is detected for each substrate 118a–e by employing the SOM detectors 108a–e. Specifically, the controller 109 monitors the photodetector 140 (e.g., via a photocurrent associated therewith) for either a presence or absence of detected light, depending on whether the configuration of FIG. 2A or the configuration of FIG. 2B is employed. If an SOM is detected for one of the substrates 118a–e, the controller 109 stores this information and preferably stores the angle the substrate is rotated past alignment with the SOM detector which detected the SOM. In this manner, those substrates for which an SOM is detected are "rough oriented", that is the controller 109 possesses information regarding the position of the substrate's SOM relative to an SOM detector (e.g., the SOM is within a certain number of degrees beyond the SOM detector). The rough oriented substrates may then (as described below with reference to steps 306–308) be supported by the substrate supports 104a–e while the remaining substrates 118a–e are rotated and rough oriented.

Specifically, in step 306, each substrate-118a–e is transferred to a different one of the substrate supports 104a–e. For example, the lift and lower mechanisms 106a–e may simultaneously or sequentially lift each of the substrate supports 104a–e a sufficient distance to transfer each substrate 118a–e onto a different one of the substrate supports 104a–e. Thereafter, in step 307, the controller 109 identifies the substrates for which an SOM has been detected (e.g., which substrates have been "completely" rough oriented) and the substrates for which an SOM has not been detected. While the substrates 118a–e are supported by the substrate supports 104a–e, the rotatable substrate handler 102 is rotated preferably in the opposite direction by the pre-determined amount (e.g., by about 900) to reset the position of the rotatable substrate handler 102 for future rotations.

In step 308, each substrate for which an SOM has not been detected is transferred to a substrate support portion of the rotatable substrate handler 102. For example, each substrate support 104a–e which supports a substrate for which an SOM has not been detected is simultaneously or sequentially lowered (via the appropriate lift and lower mechanism 106a–e) a sufficient distance to transfer the substrate onto a substrate support portion of the rotatable substrate handler 102. Each substrate support 104a–e which supports a substrate for which an SOM has been detected is not lowered so that the substrate supported thereby is not rotated further during future rotations of the rotatable wafer handler 102. Thereafter, steps 304-308 are repeated until in step 307 an SOM has been detected for each of the substrates 118a–e. In this manner, in steps 301–308, each substrate is "simultaneously" (and preferably very rapidly) rough oriented to within a pre-determined angular distance (e.g., within 90°) of alignment with an SOM detector 108a–e.

With each substrate 118a–e rough oriented and supported by one of the substrate supports 104a–e (via step 306) (e.g., with the SOM of each substrate 118a–e detected), control passes to step 309. In step 309, each substrate 118a–e is individually "fine oriented". For example, to individually fine orient the first substrate 118a, the first substrate 118a is individually transferred to the first substrate support portion 116a of the rotatable substrate handler 102 (e.g., by lowering the first substrate support 104a with the first lift and lower mechanism 106a a sufficient distance to transfer the first substrate 118a onto the first substrate support portion 116a). Thereafter, the rotatable substrate handler 102 is rotated (e.g., preferably at a slower rate than the rotation rate employed during rough orientation to allow for more precise alignment, and typically in the opposite rotation direction to the rough orient direction) until the SOM of the first substrate 118a is aligned with the first SOM detector 108a (e.g., as signified by the reflected light measured by the photodetector 140). With the first substrate 118a "fine oriented", the first substrate 118a is transferred back to the first substrate support 104a (via the first lift and lower mechanism 106a) and the above process is repeated for the remaining substrates 118b–e to individually fine orient these substrates. Thereafter, with each substrate 118a–e fine oriented and stored by the substrate supports 104a–e, the operation of the multiple substrate orienter 100 ends in step 310. The oriented substrates 118a–e may be transferred to various processing chambers (not shown) via the rotatable substrate handler 102 or via another transfer mechanism for subsequent processing.

A significant advantage of the multiple substrate orienter 100 is that it "simultaneously" orients multiple substrates while occupying a small footprint. Most conventional semiconductor processing tools employ a rotatable wafer handler (e.g., such as the rotatable substrate handler 102) which may be employed for wafer orientation as described herein. By providing a vertically stacked (e.g., compact) arrangement of substrate supports, inexpensive pneumatic cylinders and SOM detectors, and additional substrate support portions for a pre-existing wafer handler, the multiple substrate orienter 100 may be formed within a very small footprint. Further, simultaneous orientation of multiple substrates significantly increases substrate throughput when compared to conventional, single substrate orientation techniques, thereby decreasing cost per unit substrate processed. A small footprint further decreases cost per unit substrate processed by reducing cleanroom space requirements.

Figure 1C:
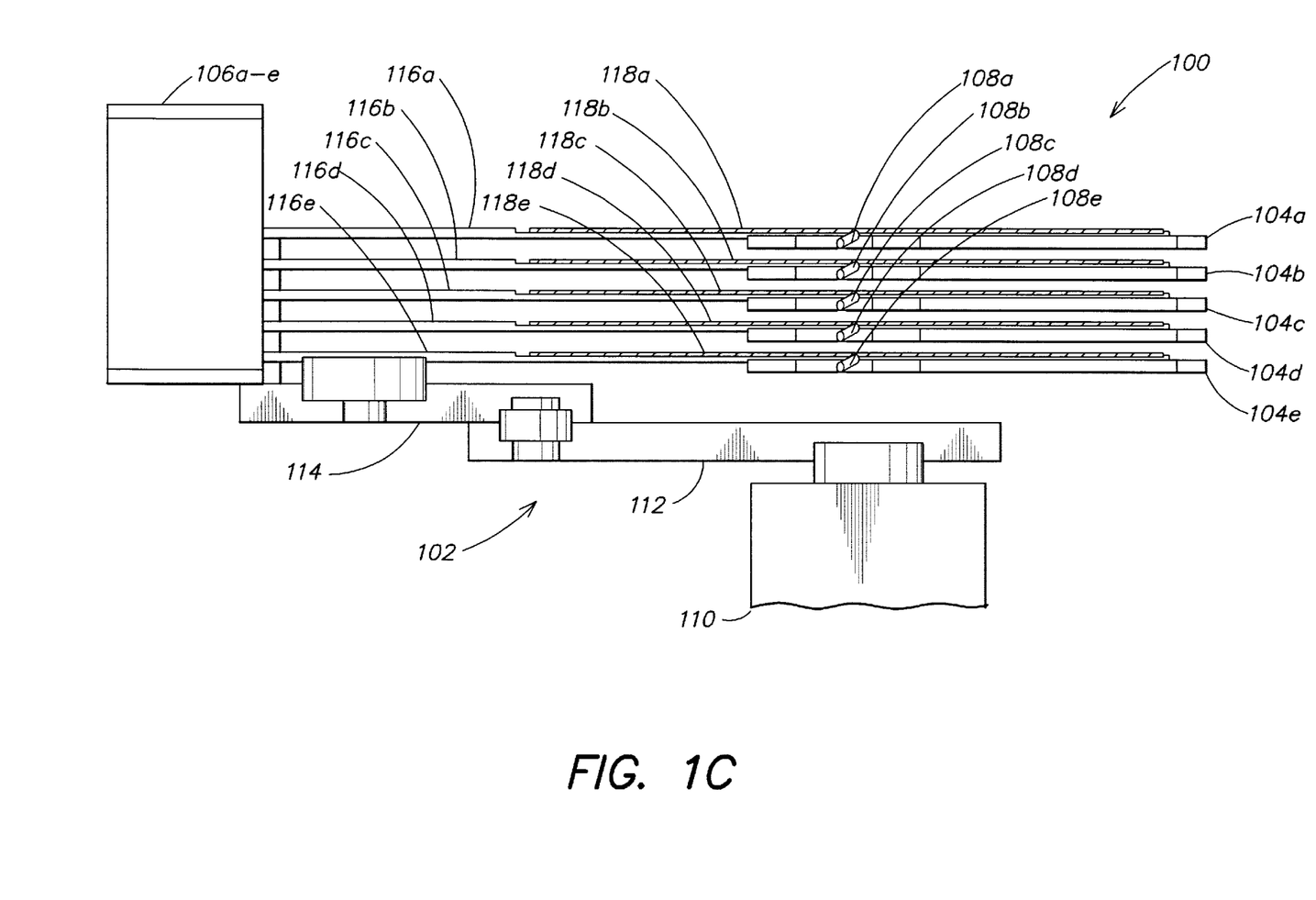
FIG. 1C is a side elevational view of an alternative embodiment of the multiple substrate orienter of FIGS. 1A and 1B.

The foregoing description discloses only the preferred embodiments of the invention, modifications of the above disclosed apparatus and method which fall within the scope of the invention will be readily apparent to those of ordinary skill in the art. For instance, while the multiple substrate orienter 100 has been described with reference to simultaneously orienting five substrates, it will be understood that any number of substrates (including only one substrate) may be so oriented. Further, instead of employing stationary substrate support portions for the rotatable substrate handler 102 and liftable/lowerable substrate supports as described with reference to FIGS. 1A and 1B, the lift and lower mechanisms 106a–e may be coupled to the substrate support portions 116a–e (as shown in FIG. 1C) rather than to the substrate supports 104a–e (as shown in FIGS. 1A and 1B). The substrate support portions 116a–e then may be lifted/lowered to perform the various individual/simultaneous substrate transfer operations described herein (e.g., substrate transfers between the substrate support portions 116a–e of the substrate handler and the substrate supports 104a–e). When only a single substrate is to be so oriented, the entire substrate handler may be lifted/lowered rather than just the substrate support portion and during the rough orient the substrate rotation may be stopped as soon as possible after SOM detection, which will result in faster fine orient times. Finally, although an extendable arm-type substrate handler is preferred, other types of substrate handlers may be employed (e.g., frog-leg type robots, etc.) as will be apparent to those of ordinary skill in the art. Similarly, the specific configuration of the substrate supports may vary as will be apparent to those of ordinary skill in the art.

Accordingly, while the present invention has been disclosed in connection with the preferred embodiments thereof, it should be understood that other embodiments may fall within the spirit and scope of the invention, as defined by the following claims.

The invention claimed is:

1. A method comprising:
providing a multiple substrate orienter having:
a rotatable substrate handler having a plurality of substrate support portions, each adapted to support a substrate;
a plurality of stacked substrate supports, each substrate support adapted to support a substrate;
a plurality of substrate orientation marking (SOM) detectors, each SOM detector coupled to a different one of the substrate supports and adapted to identify a presence of an SOM of a substrate positioned close enough to the SOM detector to allow SOM detection by the SOM detector; and
a plurality of lift and lower mechanisms, each lift and lower mechanism coupled to a different one of the substrate supports and adapted to individually lift and lower the different one of the substrate supports;
rough orienting a plurality of substrates via at least the rotatable substrate handler; and
fine orienting each rough oriented substrate via at least the rotatable substrate handler and the plurality of stacked substrate supports.

2. A method comprising:
providing a multiple substrate orienter having:
a rotatable substrate handler having a plurality of substrate support portions, each adapted to support a substrate;
a plurality of stacked substrate supports, each substrate support adapted to support a substrate;
a plurality of substrate orientation marking (SOM) detectors, each SOM detector coupled to a different one of the substrate supports and adapted to identify a presence of an SOM of a substrate positioned close enough to the SOM detector to allow SOM detection by the SOM detector; and
a plurality of lift and lower mechanisms, each lift and lower mechanism coupled to a different one of the substrate support portions of the rotatable substrate handler and adapted to individually lift and lower the different one of the substrate support portions;
rough orienting a plurality of substrates via at least the rotatable substrate handler; and
fine orienting each rough oriented substrate via at least the rotatable substrate handler and the plurality of stacked substrate supports.

3. A method comprising:
providing a substrate orienter having:
a rotatable substrate handler having a substrate support portion adapted to support a substrate;
a substrate support adapted to support a substrate;
a substrate orientation marking (SOM) detector coupled to the substrate support and adapted to identify a presence of an SOM of a substrate positioned close enough to the SOM detector to allow SOM detection by the SOM detector;
a lift and lower mechanism coupled to the substrate support and adapted to lift and lower the substrate support; and
a controller coupled to the rotatable substrate handler, to the SOM detector and to the lift and lower mechanism, the controller having program code adapted to:
rough orient a substrate loaded onto the substrate support portion of the rotatable substrate handler while rotating the substrate in a first direction; and
fine orient the rough oriented substrate while rotating the substrate in a second direction that is opposite to the first direction;
rough orienting a substrate via at least the rotatable substrate handler; and
fine orienting the rough oriented substrate via at least the rotatable substrate handler.

4. A method comprising:
providing a substrate orienter comprising:
a rotatable substrate handler having a substrate support portion adapted to support a substrate;
a substrate support adapted to support a substrate;
a substrate orientation marking (SOM) detector coupled to the substrate support and adapted to identify a presence of an SOM of a substrate positioned close enough to the SOM detector to allow SOM detection by the SOM detector;
a lift and lower mechanism coupled to the rotatable substrate handler and adapted to lift and lower at least the substrate support portion of the rotatable substrate handler; and
a controller coupled to the rotatable substrate handler, to the SOM detector and to the lift and lower mechanism, the controller having program code adapted to:
rough orient a substrate loaded onto the substrate support portion of the rotatable substrate handler; and
fine orient the rough oriented substrate;
rough orienting a substrate via at least the rotatable substrate handler; and
fine orienting the rough oriented substrate via at least the rotatable substrate handler.

5. A method of orienting a plurality of substrates comprising:
providing a rotatable substrate handler having a plurality of substrate support portions, each adapted to support a substrate;
providing a plurality of stacked substrate supports, each substrate support adapted to support a substrate;
positioning each of a plurality of substrates, each supported by a different one of the substrate support portions of the rotatable substrate handler, above a different one of the substrate supports of the substrate support stack;
simultaneously rough orienting the plurality of substrates via at least the rotatable substrate handler; and
individually fine orienting each rough oriented substrate via at least the rotatable substrate handler and the plurality of stacked substrate supports.

6. The method of claim 5 wherein individually fine orienting each rough oriented substrate comprises, once the SOM of each substrate has been detected, for each substrate supported by a substrate support of the substrate support stack, individually transfer each substrate onto a substrate support portion of the rotatable substrate handler and rotating the rotatable substrate handler until the SOM of the substrate is aligned with an SOM detector.

7. The method of claim 5 wherein simultaneously rough orienting the plurality of substrates comprises:
 a) rotating the rotatable substrate handler by a predetermined amount;
 b) detecting during rotation the presence or absence of a substrate orientation mark (SOM) of each substrate supported by a substrate support portion of the rotatable substrate handler;
 c) transferring each substrate supported by a substrate support portion of the rotatable substrate handler from its substrate support portion to a substrate support of the stacked substrate supports;
 d) determining if the SOM of each substrate has been detected, and if not:
 e) transferring each substrate support that supports a substrate for which an SOM has not been detected to a substrate support portion of the rotatable substrate handler; and
 f) repeating a)–e) until the SOM of each substrate has been detected.

8. The method of claim 7 wherein the predetermined amount is approximately 90°.

9. A method of orienting a substrate comprising:

providing a rotatable substrate handler having a substrate support portion adapted to support a substrate;

providing a substrate support adapted to support a substrate;

positioning a substrate supported by the substrate support portion of the rotatable substrate handler above the substrate support;

rough orienting the substrate via at least the rotatable substrate handler; and fine orienting the rough oriented substrate via at least the rotatable substrate handler and the substrate support.

* * * * *